(12) United States Patent
Yamamoto et al.

(10) Patent No.: US 8,395,314 B2
(45) Date of Patent: Mar. 12, 2013

(54) LIGHT-EMITTING ELEMENT, DISPLAY DEVICE, AND ELECTRONIC APPARATUS HAVING A PLURALITY OF INTERLAYERS

(75) Inventors: Hidetoshi Yamamoto, Suwa (JP); Tetsuji Fujita, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/974,735

(22) Filed: Dec. 21, 2010

(65) Prior Publication Data

US 2011/0148289 A1    Jun. 23, 2011

(30) Foreign Application Priority Data

Dec. 22, 2009  (JP) ................. 2009-291439
Dec. 20, 2010  (JP) ................. 2010-283364

(51) Int. Cl.
 *H01J 1/63*   (2006.01)
(52) U.S. Cl. ........ 313/504; 313/506; 313/507; 313/508; 445/24; 445/25; 428/690
(58) Field of Classification Search .......... 313/498–512; 315/169.1, 169.3; 428/690–691, 917; 438/26–29, 438/34, 82; 427/66, 532–535, 539
See application file for complete search history.

(56) References Cited

U.S. PATENT DOCUMENTS

| 7,960,912 B2 * | 6/2011 | Yasukawa et al. ............ 313/506 |
| 2006/0158104 A1 | 7/2006 | Iijima et al. |
| 2009/0261360 A1 * | 10/2009 | Yasukawa et al. ............ 257/89 |

FOREIGN PATENT DOCUMENTS

JP    A-2006-172762    6/2006

* cited by examiner

*Primary Examiner* — Tracie Y Green
(74) *Attorney, Agent, or Firm* — Oliff & Berridge, PLC

(57) ABSTRACT

A light-emitting element includes a first interlayer that is disposed between a first and second light-emitting layers so as to be in contact with them and is constituted by containing the same or the same type of material as the host material of the first light-emitting layer and not substantially containing materials having a light-emitting property; and a second interlayer that is disposed between the second and a third light-emitting layer so as to be in contact with them and is constituted by containing the same or the same type of material as the host material of the second light-emitting layer and/or the host material of the third light-emitting layer and not substantially containing materials having a light-emitting property.

21 Claims, 5 Drawing Sheets

LIGHT-EMITTING ELEMENT, DISPLAY DEVICE, AND ELECTRONIC APPARATUS HAVING A PLURALITY OF INTERLAYERS

BACKGROUND

1. Technical Field

The present invention relates to a light-emitting element, a display device, and an electronic apparatus.

2. Related Art

An organic electroluminescence element (so-called organic EL element) is a light-emitting element having a structure in which at least one light-emitting organic layer is interposed between an anode and a cathode. In such a light-emitting element, by applying an electric field between the cathode and the anode, electrons are injected into the light-emitting layer from the cathode side, and holes are injected into the light-emitting layer from the anode side. As a result, the electrons and the holes are recombined in the light-emitting layer to generate excitons, and the energy when the excitons return to the ground state is emitted as light.

As such a light-emitting element, for example, a light-emitting element in which three light-emitting layers corresponding to three colors, red (R), green (G), and blue (B), are laminated between a cathode and an anode to emit white light is known (for example, see JP-A-2006-172762). Such a light-emitting element that emits white light can display a full-color image by being used in combination with color filters arranged so that three colors of red (R), green (G), and blue (B) are allocated to each pixel.

In the light-emitting element disclosed in JP-A-2006-172762, the energy of excitons can be prevented from moving between the light-emitting layers by disposing an interlayer between the light-emitting layers. On this occasion, if the interlayer is bipolar allowing both electrons and holes to move, electrons and holes can be injected into each light-emitting layer while retaining excellent resistance of the interlayer against electrons and holes, which allows to emit white light.

However, in the light-emitting element disclosed in JP-A-2006-172762, since the interlayers having the same structure are disposed between the light-emitting layers that emit the respective color lights, the numbers of electrons and holes injected into the light-emitting layers differ from one another among the light-emitting layers. As a result, there is a problem in that the light-emitting layers cannot be allowed to emit light in a balanced manner.

SUMMARY

An advantage of some aspects of the invention is to provide a light-emitting element that can emit white light by allowing light-emitting layers to emit light in a balanced manner and to provide a highly reliable display device and electronic apparatus having the light-emitting element.

The advantage can be achieved by the following invention.

A light-emitting element of the invention includes:

a cathode;

an anode;

a first light-emitting layer that is disposed between the cathode and the anode and is constituted by containing a host material and a guest material added to the host material and being a red light-emitting material that emits light in red as a first color;

a second light-emitting layer that is disposed between the first light-emitting layer and the cathode and is constituted by containing a host material and a guest material added to the host material and being a second color light-emitting material that emits light in a second color;

a third light-emitting layer that is disposed between the second light-emitting layer and the cathode and is constituted by containing a host material and a guest material added to the host material and being a third color light-emitting material that emits light in a third color;

a first interlayer that is disposed between the first light-emitting layer and the second light-emitting layer so as to be in contact with them and is constituted by containing the same or the same type of material as the host material of the first light-emitting layer and not substantially containing materials having a light-emitting property, for adjusting movement of holes and electrons between the first light-emitting layer and the second light-emitting layer; and a second interlayer that is disposed between the second light-emitting layer and the third light-emitting layer so as to be in contact with them and is constituted by containing the same or the same type of material as the host material of the second light-emitting layer and/or the host material of the third light-emitting layer and not substantially containing materials having a light-emitting property, for adjusting movement of holes and electrons between the second light-emitting layer and the third light-emitting layer.

Such a light-emitting element can allow the light-emitting layers to emit light in a balanced manner for emitting white light.

In the light-emitting element of the invention, the host material of the second light-emitting layer and the host material of the third light-emitting layer are preferably the same.

By doing so, the second color light and the third color light are emitted in both the light-emitting layers in a balanced manner.

In the light-emitting element of the invention, the host material of the second interlayer and the host material of the second light-emitting layer are preferably the same.

By doing so, transfer of a carrier (electrons or holes) can be smoothly performed between the second light-emitting layer and the second interlayer, which contain the same host material. As a result, an increase in driving voltage of the light-emitting element can be adequately inhibited or prevented, and also diffusion of excitons can be adequately inhibited or prevented.

In the light-emitting element of the invention, the second interlayer preferably has a thickness of 2 to 10 nm.

By setting the thickness of the second interlayer in such a range, the diffusion of excitons can be inhibited or prevented to reliably control the movement of the carrier (holes or electrons).

In the light-emitting element of the invention, the second interlayer preferably contains an acene-based material as the host material.

By doing so, since both the second light-emitting layer and the third light-emitting layer can emit light with high light-emitting efficiencies, they can emit light in a balanced matter and can extend their life cycles.

In the light-emitting element of the invention, the first interlayer preferably contains an amine-based material, in addition to the host material.

The amine-based material is excellent in hole-transporting property, and the host material is excellent in electron-transporting property. Consequently, the first interlayer can have both an electron-transporting property and a hole-transporting property. That is, the first interlayer has a bipolar property.

The display device of the invention includes the light-emitting element of the invention.

By doing so, the display device is provided with high reliability.

The electronic apparatus of the invention includes the display device of the invention.

By doing so, the electronic apparatus is provided with high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

The light-emitting element, the display device, and the electronic apparatus of the invention will now be described referring to preferred embodiments shown in the attached drawings.

Light-Emitting Element

Figure 1:
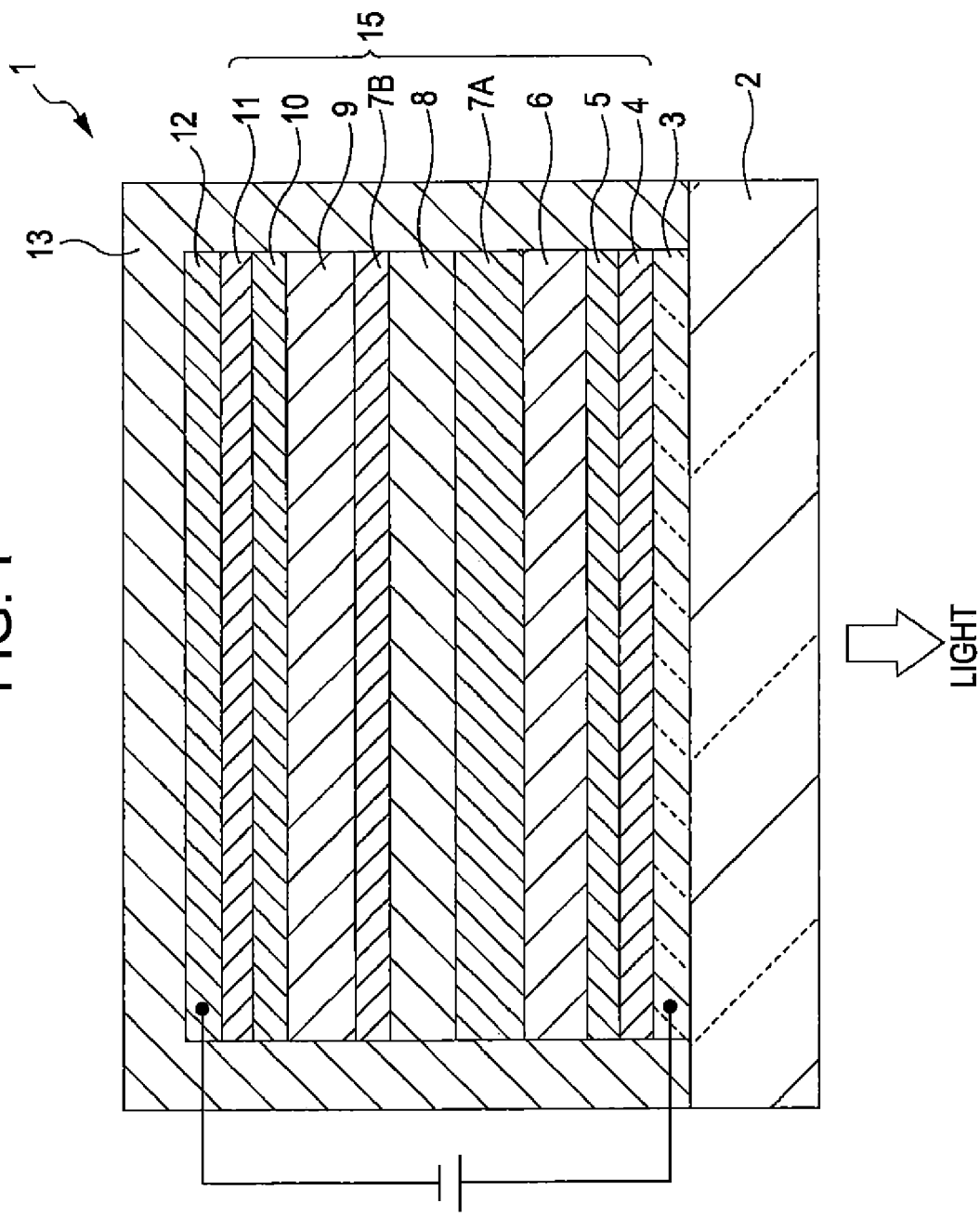
FIG. 1 is a view schematically illustrating a vertical cross-section of a light-emitting element of the invention.

FIG. 1 is a view schematically illustrating a vertical cross-section of a light-emitting element of the invention. Note that, hereinafter, the upper side in FIG. 1 is referred to as "upper", and the lower side is referred to as "lower", for convenience of explanation.

The light-emitting element (electroluminescence element) 1 shown in FIG. 1 emits white light by emitting red (R), green (G), and blue (B) light.

In this light-emitting element 1, between an anode 3 and a cathode 12, a hole injection layer 4, a hole-transporting layer 5, a red light-emitting layer (first light-emitting layer) 6, a first interlayer 7A, a blue light-emitting layer (second light-emitting layer) 8, a second interlayer 7B, a green light-emitting layer (third light-emitting layer) 9, an electron-transporting layer 10, and an electron injection layer 11 are laminated in this order.

In other words, the light-emitting element 1 is constituted by interposing, between two electrodes (the anode 3 and the cathode 12), a laminate 15 in which the hole injection layer 4, the hole-transporting layer 5, the red light-emitting layer 6, the first interlayer 7A, the blue light-emitting layer 8, the second interlayer 7B, the green light-emitting layer 9, the electron-transporting layer 10, and the electron injection layer 11 are laminated in this order.

Then, the entire light-emitting element 1 is disposed on a substrate 2 and is sealed with a sealing member 13.

In such a light-emitting element 1, to each light-emitting layer, that is, the red light-emitting layer 6, the blue light-emitting layer 8, and the green light-emitting layer 9, electrons are supplied (injected) from the cathode 12 side, and holes are supplied (injected) from the anode 3 side. In each light-emitting layer, holes and electrons are recombined to generate excitons by the energy released in the recombination, and the energy (fluorescence or phosphorescence) when the excitons return to the ground state is emitted as red, blue, or green light from the red light-emitting layer 6, the blue light-emitting layer 8, or the green light-emitting layer 9, respectively. As a result, the light-emitting element 1 emits white light.

In particular, in the invention, since the light-emitting element 1 includes the first interlayer 7A between the red light-emitting layer 6 and the blue light-emitting layer 8 and includes the second interlayer 7B between the blue light-emitting layer 8 and the green light-emitting layer 9, the movement of holes and electrons between the red light-emitting layer 6 and the blue light-emitting layer 8 can be adjusted, and also the movement of holes and electrons between the blue light-emitting layer 8 and the green light-emitting layer 9 can be adjusted. Therefore, the transfer of energy of the excitons between the red light-emitting layer 6 and the blue light-emitting layer 8 can be blocked, and the transfer of energy of the excitons between the blue light-emitting layer 8 and the green light-emitting layer 9 can be blocked. As a result, the red light-emitting layer 6, the blue light-emitting layer 8, and the green light-emitting layer 9 are allowed to emit light in a balanced manner, and the light-emitting element 1 further reliably emit white light.

The substrate 2 supports the anode 3. Since the light-emitting element 1 of this embodiment has a structure in which light is emitted from the substrate 2 side (bottom emission-type), the substrate 2 and the anode 3 are each substantially transparent (colorless and transparent, colored transparent, or semitransparent).

Examples of material constituting the substrate 2 include resin materials, such as polyethylene terephthalate, polyethylene naphthalate, polypropylene, cycloolefin polymers, polyamide, polyether sulfone, polymethyl methacrylate, polycarbonate, and polyacrylate, and glass materials, such as quartz glass and soda glass. These materials can be used alone or in combination of two or more thereof.

The thickness of the substrate 2 is not particularly limited, but is preferably about 0.1 to 30 mm and more preferably about 0.1 to 10 mm.

When the light-emitting element 1 has a structure in which light is emitted from the opposite side of the substrate 2 (top emission-type), the substrate 2 may be either a transparent substrate or an opaque substrate.

Examples of the opaque substrate include ceramic substrates such as alumina substrates, metal substrates, such as stainless steel substrates, having surfaces provided with oxide films (insulating films), and resin substrates.

On this substrate 2, the light-emitting element 1 is disposed. Each component constituting the light-emitting element 1 will be described below one by one.

Anode

The anode 3 is an electrode for injecting holes to the hole-transporting layer 5 through the hole injection layer 4 described below. The anode 3 is preferably made of a material that has a high work function and is excellent in conductivity.

Examples of the material constituting the anode 3 include oxides, such as indium tin oxide (ITO), indium zinc oxide (IZO), $In_3O_3$, $SnO_2$, Sb-containing $SnO_2$, and Al-containing ZnO; and Au, Pt, Ag, Cu, and alloys thereof. These materials can be used alone or in combination of two or more thereof.

The average thickness of the anode 3 is not particularly limited, but is preferably about 10 to 200 nm and more preferably about 50 to 150 nm.

Cathode

The cathode 12 is an electrode for injecting electrons to the electron-transporting layer 10 through the electron injection layer 11 described below. The cathode 12 is preferably made of a material having a low work function.

Examples of the material constituting the cathode 12 include Li, Mg, Ca, Sr, La, Ce, Er, Eu, Sc, Y, Yb, Ag, Cu, Al, Cs, Rb, and alloys containing these materials. These can be used alone or in combination of two or more thereof (for example, a laminate of a plurality of layers).

In particular, when the cathode 12 is constituted of an alloy, the alloy preferably contain a stable metal element such as Ag, Al, or Cu. Specifically, the alloy is preferably MgAg, AlLi, or CuLi. By using such an alloy as the material constituting the cathode 12, the electron injection efficiency and stability of the cathode 12 can be improved.

The average thickness of the cathode 12 is not particularly limited, but is preferably about 100 to 10000 nm and more preferably about 200 to 500 nm.

Since the light-emitting element 1 of this embodiment is a bottom emission-type, light transmissivity is not required in the cathode 12.

Hole Injection Layer

The hole injection layer 4 has a function of improving the efficiency in hole injection from the anode 3.

The material (hole injection material) constituting the hole injection layer 4 is not particularly limited, but examples thereof include amine-based compounds such as a compound (N,N,N',N'-tetraphenyl-p-diaminobenzene) represented by the following Formula (1) and its derivatives. These compounds can be used alone or in combination of two or more thereof.

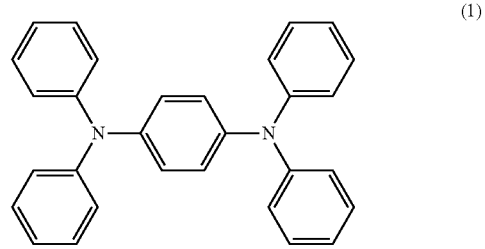 [SMILES: c1ccc(N(c2ccccc2)c2ccc(N(c3ccccc3)c3ccccc3)cc2)cc1]

(1)

The derivatives of the compound represented by Formula (1) are not particularly limited, but examples thereof include compounds represented by the following Formulae (2) to (10).

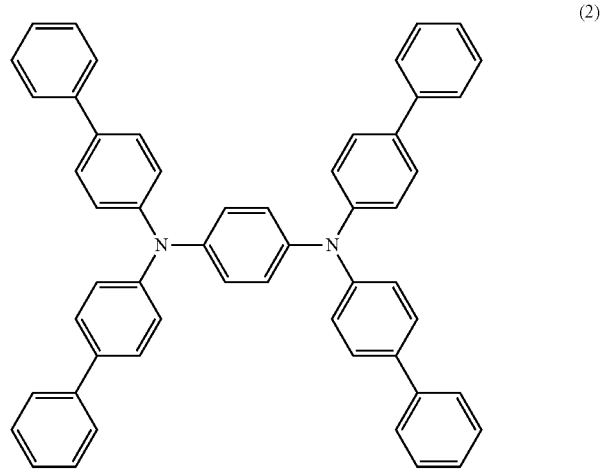

(2)

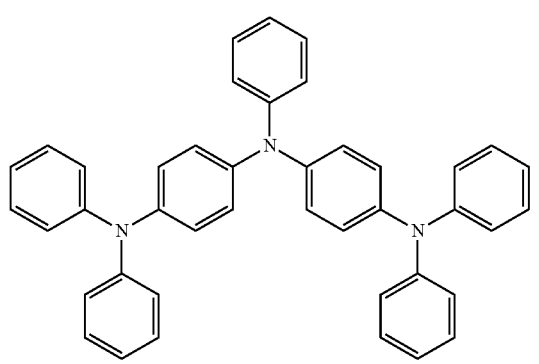

(3)

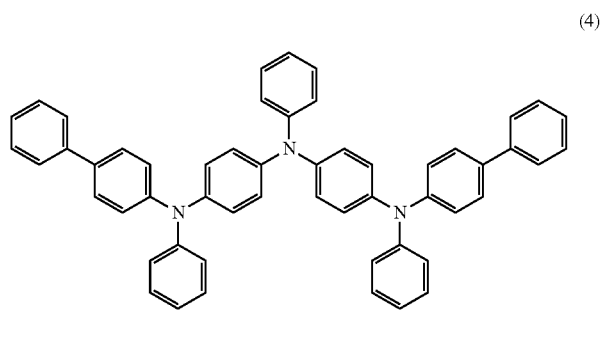

(4)

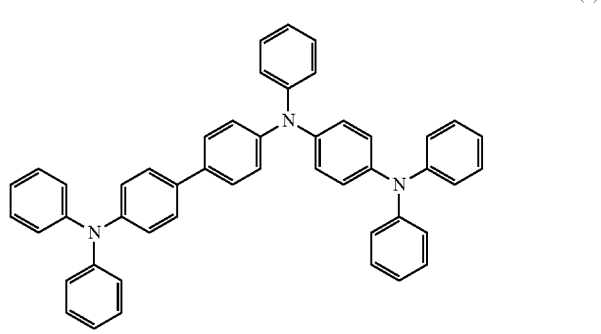

(5)

-continued

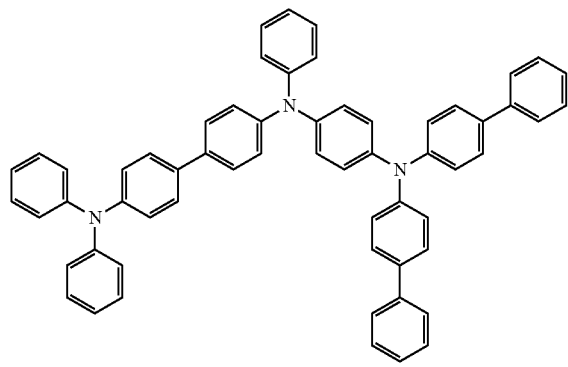
(6)

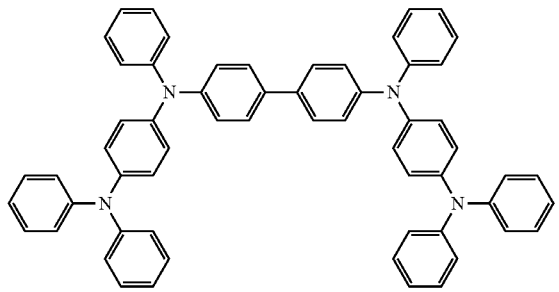
(7)

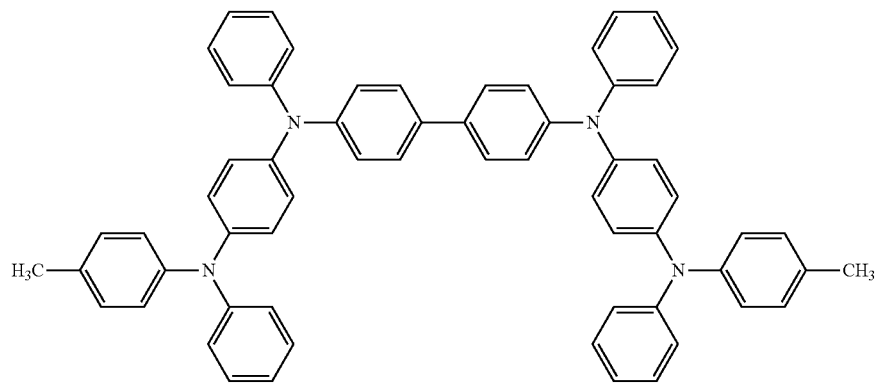
(8)

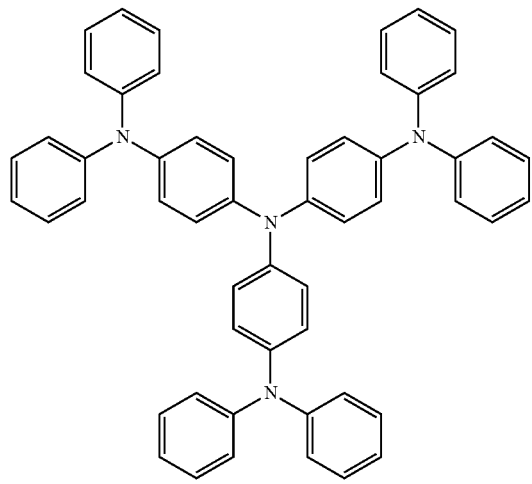
(9)

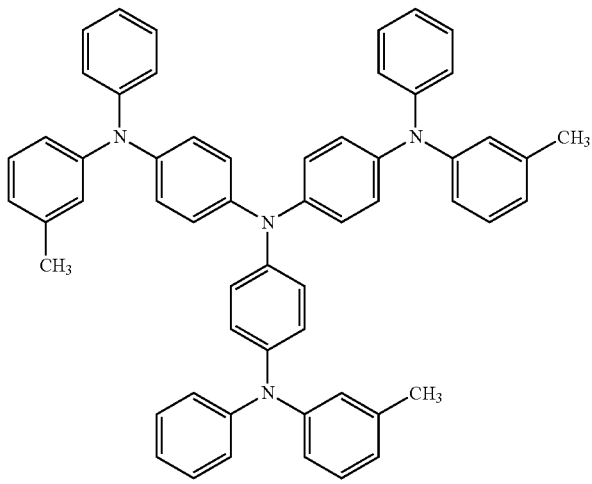
(10)

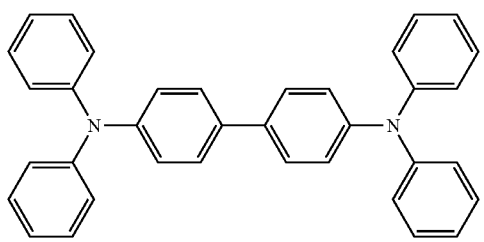
(11)

The average thickness of the hole injection layer 4 is not particularly limited, but is preferably about 5 to 150 nm and more preferably about 10 to 100 nm.

Note that the hole injection layer 4 may be omitted.

Hole-Transporting layer

The hole-transporting layer 5 has a function of transporting holes injected from the anode 3 through the hole injection layer 4 to the red light-emitting layer 6.

The material constituting the hole-transporting layer 5 is not particularly limited, but examples thereof include amine-based compounds such as a compound (N,N,N',N'-tetraphenylbenzidine) represented by the following Formula (11) and its derivatives. These compounds can be used alone or in combination of two or more thereof.

The derivatives of the compound represented by Formula (11) are not particularly limited, but examples thereof include compounds represented by the following Formulae (12) to (16).

(12)

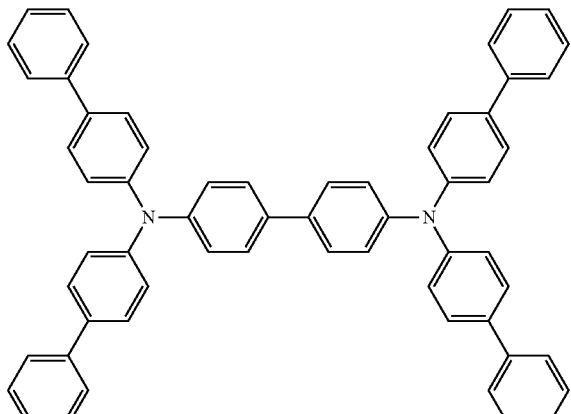

(13)

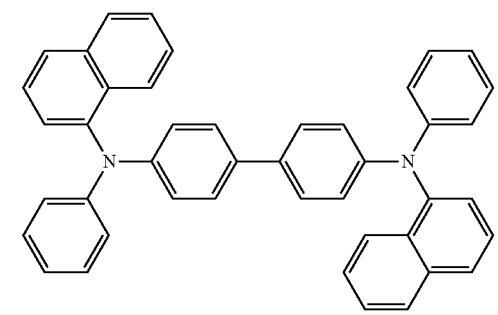

(14)

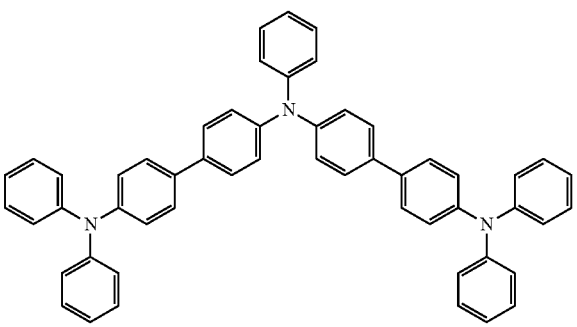

(15)

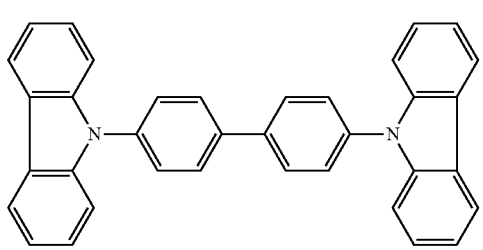

(16)

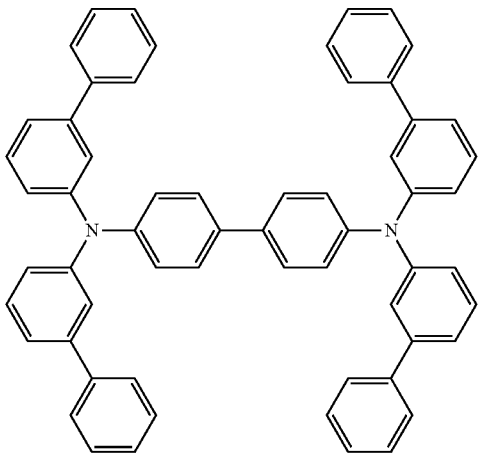

The average thickness of the hole-transporting layer 5 is not particularly limited, but is preferably about 10 to 150 nm and more preferably about 10 to 100 nm.

Note that the hole-transporting layer 5 may be omitted.

Red Light-Emitting Layer

The red light-emitting layer (first light-emitting layer) 6 is constituted by containing a red light-emitting material that emits light in red (first color).

The red light-emitting material is not particularly limited, but various types of red fluorescent materials and red phosphorescent materials can be used alone or in combination of two or more thereof.

As the red fluorescent material, any material that emits red fluorescence can be used without particular limitation, and examples thereof include perylene derivatives such as a compound (diindenoperylene derivative) represented by the following Formula (17), europium complexes, benzopyran derivatives, rhodamine derivatives, benzothioxanthene derivatives, porphyrin derivatives, nile red, 2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4-ylidene) propanedinitrile (DCJTB), and 4-(dicyanomethylene)-2-methyl-6-(p-dimethylaminostyryl)-4H-pyrane (DCM).

(17)

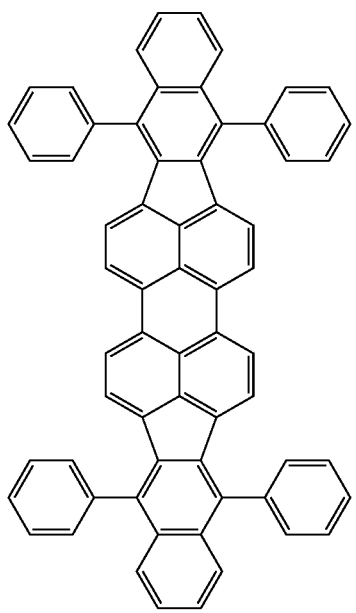

Among them, a diindenoperylene derivative is preferably used as the red light-emitting material. By doing so, the red light-emitting layer 6 can emit red light with higher brightness.

As the red phosphorescent material, any material that emits red phosphorescence can be used without particular limitation, and examples thereof include metal complexes, such as iridium, ruthenium, platinum, osmium, rhenium, and palladium complexes, and those in which at least one of ligands of the metal complexes has, for example, a phenylpyridine skeleton, a bipyridyl skeleton, or a porphyrin skeleton. More specific examples include tris(1-phenylisoquinoline)iridium, bis[2-(2'-benzo[4,5-α]thienyl)pyridinate-N,$C^{3'}$]iridium (acetylacetonate) (btp2Ir(acac)), 2,3,7,8,12,13,17,18-octaethyl-12H,23H-porphyrin-platinum(II), bis[2-(2'-benzo[4,5-a]thienyl)pyridinate-N,$C^{3'}$]iridium, and bis(2-phenylpyridine)iridium (acetylacetonate).

The red light-emitting layer 6 further contains a host material regarding the red light-emitting material as a guest material, in addition to the red light-emitting material.

The host material has a function of exciting the red light-emitting material by generating excitons by recombination of holes and electrons and by transferring the energy of the excitons to the red light-emitting material (forster transfer or dexter transfer). When such a host material is used, for example, the host material can be doped with the red light-emitting material being the guest material as a dopant.

As the host material, any material that can achieve the above-described function for the red light-emitting material can be used without particular limitation, and examples thereof, when the red light-emitting material contains the red fluorescent material, include naphthalene derivatives such as compounds represented by the following Formulae (18) to (21), naphthalene derivatives, acene derivatives (acene-based materials) such as anthracite derivatives, distyrylarylene derivatives, perylene derivatives, distyrylbenzene derivatives, distyrylamine derivatives, quinolinolato metal complexes such as a tris(8-quinolinolato)aluminum complex (Alq₃), triarylamine derivatives such as tetramers of triphenyl amine, oxadiazole derivatives, silole derivatives, dicarbazole derivatives, oligothiophene derivatives, benzopyran derivatives, triazole derivatives, benzoxazole derivatives, benzothiazole derivatives, quinoline derivatives, and 4,4'-bis(2,2'-diphenylvinyl)biphenyl (DPVBi). These can be used alone or in combination of two or more thereof.

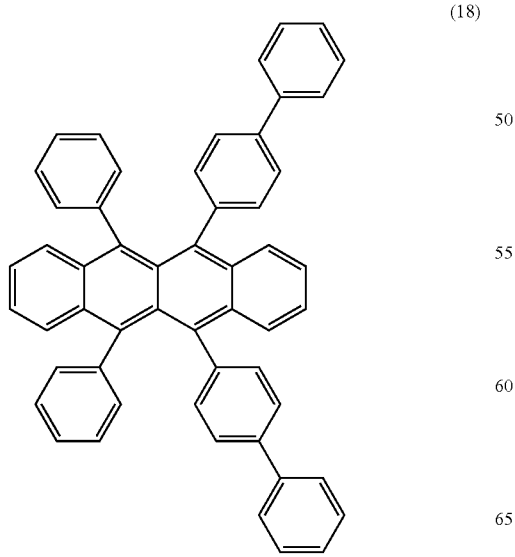

(18)

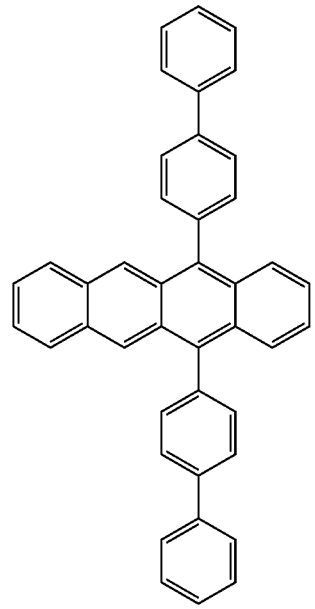

(19)

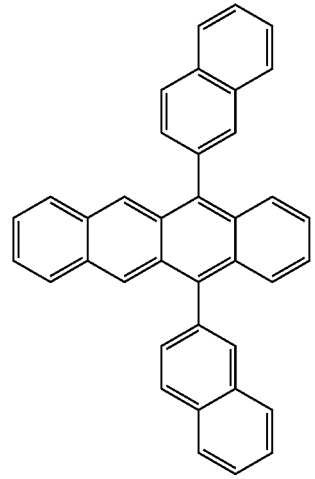

(20)

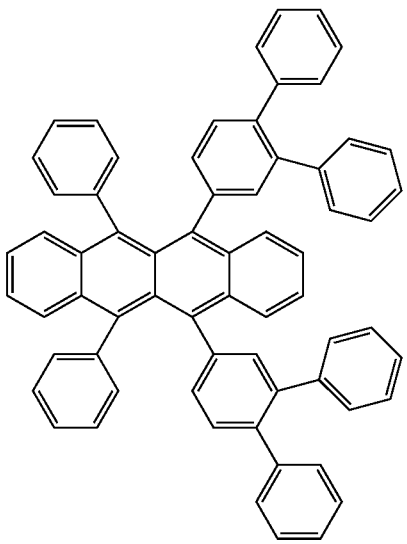

(21)

In particular, the host material of the red light-emitting layer 6 is preferably an acene derivative (especially, a naphthacene derivative). In particular, when a diindenoperylene derivative is used as the red light-emitting material, the red light-emitting layer 6 containing the naphthacene derivative can emit red light with higher brightness and higher efficiency.

Examples of the host material, when the red light-emitting material contains a red phosphorescent material, include carbazole derivatives such as 3-phenyl-4-(1'-naphtyl)-5-phenyl-carbazole and 4,4'-N,N'-dicarbazole biphenyl (CBP). These materials can be used alone or in combination of two or more thereof.

When the above-mentioned red light-emitting material (guest material) and host material are used, the content (doping amount) of the red light-emitting material in the red light-emitting layer 6 is preferably 0.01 to 10 wt % and more preferably 0.1 to 5 wt %. The red light-emitting material content in such a range can optimize the light-emitting efficiency.

The average thickness of the red light-emitting layer 6 is not particularly limited, but is preferably about 10 to 150 nm and more preferably about 10 to 100 nm.

The above-described red light-emitting materials have relatively small band gaps, easily capture holes and electrons, and easily emit light. Therefore, by disposing the red light-emitting layer 6 on the anode 3 side and disposing the blue light-emitting layer 8 and the green light-emitting layer 9, which have large band gaps and do not easily emit light, on the cathode 12 side, these light-emitting layers are allowed to emit light in a balanced manner.

First Interlayer

The first interlayer 7A is disposed between the red light-emitting layer 6 described above and the blue light-emitting layer 8 described below so as to be in contact with them. The first interlayer 7A is constituted by containing the same or the same type of material as the host material of the red light-emitting layer 6 and not substantially containing materials having a light-emitting property and has a function of adjusting movement of carriers (holes and electrons) between the red light-emitting layer (first light-emitting layer) 6 and the blue light-emitting layer (second light-emitting layer) 8. This function allows both the red light-emitting layer 6 and the blue light-emitting layer 8 to efficiently emit light.

The constitutional material of the first interlayer 7A is not particularly limited as long as the first interlayer 7A is constituted by containing the same or the same type of material as the host material of the red light-emitting layer 6 and not substantially containing materials having a light-emitting property and can achieve the function of adjusting the carrier movement as described above, but the first interlayer 7A containing an acene-based material as the material that is the same or the same type of material as the host material of the red light-emitting layer 6 is preferably used.

By using such a material, the energy level of the highest occupied molecular orbit (HOMO) of the first interlayer 7A can be set to a level lower than those of the HOMOs of both the red light-emitting layer 6 and the blue light-emitting layer 8, and also the energy level of the lowest unoccupied molecular orbit (LUMO) of the first interlayer 7A can be set to a level higher than those of the LUMOs of both the red light-emitting layer 6 and the blue light-emitting layer 8. As a result, the transfer of energy of the excitons between the red light-emitting layer 6 and the blue light-emitting layer 8 can be more reliably blocked.

The acene-based material is not particularly limited as long as it has an acene skeleton and achieves the effect described above, and examples thereof include naphthalene derivatives, anthracene derivatives, tetracene (naphthacene) derivatives, pentacene derivatives, hexacene derivatives, and heptacene derivatives. These materials can be used alone or in combination of two or more thereof, but the tetracene (naphthacene) derivatives are preferred.

The tetracene (naphthacene) derivatives are not particularly limited, the same naphthacene derivatives described in the host material of the red light-emitting layer 6 can be used.

These naphthacene derivatives have a bipolar property. Therefore, the first interlayer 7A can smoothly transfer holes from the red light-emitting layer 6 to the blue light-emitting layer 8 and can also smoothly transfer electrons from the blue light-emitting layer 8 to the red light-emitting layer 6. Furthermore, since the first interlayer 7A has excellent resistance to electrons and holes, the first interlayer 7A is prevented from being deteriorated. As a result, durability of the light-emitting element 1 can be improved.

The acene-based material content in the first interlayer 7A is not particularly limited, but is preferably 10 to 90 wt %, more preferably 30 to 70 wt %, and most preferably 40 to 60 wt %.

Furthermore, most preferably, the material constituting the first interlayer 7A contains an amine-based material (amine derivative), in addition to the acene-based material described above.

The amine-based material (that is, a material having an amine skeleton) has an excellent hole-transporting property, and the acene-based material (that is, a material having an acene skeleton) has an excellent electron-transporting property. Consequently, the first interlayer 7A has both an electron-transporting property and a hole-transporting property. That is, the first interlayer 7A has a bipolar property. When the first interlayer 7A has a bipolar property, holes can be smoothly transferred from the red light-emitting layer 6 to the blue light-emitting layer 8 through the first interlayer 7A, and electrons can be smoothly transferred from the blue light-emitting layer 8 to the red light-emitting layer 6 through the first interlayer 7A. As a result, electrons and holes are efficiently injected to the red light-emitting layer 6 and the blue light-emitting layer 8, respectively, to allow them to emit light.

Since the first interlayer 7A has a bipolar property, its resistance to the carriers (electrons and holes) is excellent. In addition, since the acene-based material is excellent in resistance to excitons, the first interlayer 7A can be inhibited or prevented from being deteriorated even if electrons and holes are recombined to generate excitons in the first interlayer 7A. Consequently, deterioration of the first interlayer 7A due to excitons can be inhibited or prevented. As a result, the light-emitting element 1 can have excellent durability.

The amine-based material used in the first interlayer 7A is not particularly limited as long as it has an amine skeleton and can achieve the effect described above. For example, materials having an amine skeleton among the above-described hole-transporting materials can be used, but benzidine-based amine derivatives are preferred.

In particular, among the benzidine-based amine derivatives, an amine-based material used for the first interlayer 7A preferably has two or more naphtyl groups. Examples of such a benzidine-based amine derivative include N,N'-bis(1-naphtyl)-N,N'-diphenyl[1,1'-biphenyl]-4,4'-diamine (α-NPD) represented by the following Formula (22) and N,N,N',N'- tetranaphtyl-benzidine (TNB) represented by the following Formula (23).

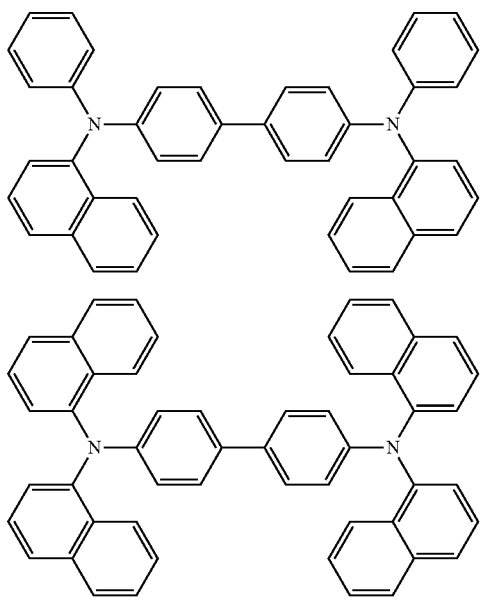

The amine-based material generally has an excellent hole-transporting property and a hole mobility higher than that of the acene-based material described below. Therefore, holes can be smoothly transferred from the red light-emitting layer 6 to the blue light-emitting layer 8 through the first interlayer 7A.

The amine-based material content in the first interlayer 7A is not particularly limited, but is preferably 10 to 90 wt %, more preferably 30 to 70 wt %, and most preferably 40 to 60 wt %.

The average thickness of the first interlayer 7A is not particularly limited, but is preferably 1 to 100 nm, more preferably 3 to 50 nm, and most preferably 5 to 30 nm. By doing so, the first interlayer 7A can reliably adjust the transfer of holes and electrons between the red light-emitting layer 6 and the blue light-emitting layer 8, while inhibiting an increase in driving voltage.

In contrast to this, an average thickness of the first interlayer 7A larger than the above-mentioned upper limit may significantly increase the driving voltage or make light emission (in particular, white light emission) by the light-emitting element 1 difficult, depending on, for example, the constitutional material of the first interlayer 7A. On the other hand, an average thickness of the first interlayer 7A smaller than the above-mentioned lower limit may make it difficult to reliably adjust the transfer of holes and electrons between the red light-emitting layer 6 and the blue light-emitting layer 8, depending on, for example, the constitutional material or the driving voltage of the first interlayer 7A.

Blue Light-Emitting Layer

The blue light-emitting layer (second light-emitting layer) 8 is constituted by containing a blue light-emitting material that emits blue light (second color).

Examples of the blue light-emitting material include various types of blue fluorescent materials and blue phosphorescent materials. These materials can be used alone or in combination of two or more thereof.

As the blue fluorescent materials, any material that emits blue fluorescence can be used without particular limitation, and examples thereof include distyryl amine derivatives such as a distyryl diamine compound represented by the following Formula (24), fluoranthene derivatives, pyrene derivatives, perylene and its derivatives, anthracene derivatives, benzoxazole derivatives, benzothiazole derivatives, benzoimidazole derivatives, chrysene derivatives, phenanthrene derivatives, distyrylbenzene derivatives, tetraphenylbutadiene, 4,4''-bis (9-ethyl-3-carbazovinylene)-1,1'-biphenyl (BCzVBi), poly [(9.9-dioctylfluorene-2,7-diyl)-co-(2,5-dimethoxybenzene-1,4-diyl)], poly[(9,9-dihexyloxyfluorene-2,7-diyl)-ortho-co-(2-methoxy-5-{2-ethoxyhexyloxy}phenylene-1,4-diyl)], and poly[(9,9-dioctylfluorene-2,7-diyl)-co-(ethylnylbenzene)].

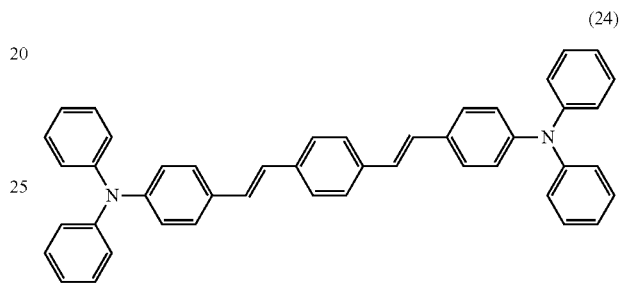

As the blue phosphorescent materials, any material that emits blue phosphorescence can be used without particular limitation, and examples thereof include metal complexes such as iridium, ruthenium, platinum, osmium, rhenium, and palladium complexes. More specific examples include bis[4, 6-difluorophenylpyridinate-N,$C^{2'}$]-picolinate-iridium, tris [2-(2,4-difluorophenyl)pyridinate-N,$C^{2'}$]iridium, bis[2-(3,5-trifluoro)pyridinate-N,$C^{2'}$]-picolinate-iridium, and bis(4,6-difluorophenylpyridinate-N,$C^{2'}$)iridium (acetylacetonate).

The blue light-emitting layer 8 further contains a host material regarding the blue light-emitting material as a guest material, in addition to the blue light-emitting material.

The host material may be the same host material as those described in the red light-emitting layer (first light-emitting layer) 6.

The host material of the blue light-emitting layer 8 is preferably an acene derivative (acene-based material), like the host material of the red light-emitting layer 6. By doing so, the blue light-emitting layer 8 can emit blue light with higher brightness and higher efficiency.

Second Interlayer

The second interlayer 7B is disposed between the blue light-emitting layer 8 described above and the green light-emitting layer 9 described below so as to be in contact with them. The second interlayer 7B is constituted by containing the same or the same type of material as the host material of the blue light-emitting layer 8 and/or the host material of the green light-emitting layer 9 and not substantially containing materials having a light-emitting property and has a function of adjusting movement of carriers (holes and electrons) between the blue light-emitting layer (second light-emitting layer) 8 and the green light-emitting layer (third light-emitting layer) 9. Since this function can block the transfer of energy of the excitons between the blue light-emitting layer 8 and the green light-emitting layer 9, the energy transfer from the blue light-emitting layer 8 to the green light-emitting layer 9 is inhibited to allow both the blue light-emitting layer 8 and the green light-emitting layer 9 to efficiently emit light. That is, since the blue light-emitting layer 8 and the green light-emitting layer 9 are allowed to emit light in a balanced manner, the light-emitting element 1 can emit white light.

In the case in that the second interlayer 7B is not provided, the energy transfer from the blue light-emitting layer 8 to the green light-emitting layer 9 described above is notably recognized when the light-emitting element 1 emits light in a low brightness region. In the invention, the energy transfer from the blue light-emitting layer 8 to the green light-emitting layer 9 is inhibited by disposing the second interlayer 7B between these light-emitting layers for allowing the blue light-emitting layer 8 and the green light-emitting layer 9 to reliably emit light even when the light-emitting element 1 emit light in the low brightness region.

The constitutional material of the second interlayer 7B is not particularly limited as long as the second interlayer 7B is constituted by containing the same or the same type of material as the host material of the blue light-emitting layer 8 and/or the host material of the green light-emitting layer 9 and not substantially containing materials having a light-emitting property and can achieve the function of adjusting the carrier movement as described above, but the second interlayer 7B containing an acene-based material as the material that is the same or the same type of material as the host material is preferably used.

By using such a material, the energy level of the highest occupied molecular orbit (HOMO) of the second interlayer 7B can be set to a level lower than those of the HOMOs of both the blue light-emitting layer 8 and the green light-emitting layer 9, and also the energy level of the lowest unoccupied molecular orbit (LUMO) of the second interlayer 7B can be set to a level higher than those of the LUMOs of both the blue light-emitting layer 8 and the green light-emitting layer 9. As a result, the transfer of energy of the excitons between the blue light-emitting layer 8 and the green light-emitting layer 9 can be more reliably blocked. Consequently, the blue light-emitting layer 8 and the green light-emitting layer 9 both can emit light with high efficiency, which allows them to emit light in a balanced manner and also extends their life cycles.

The acene-based material may be the same as those described in the first interlayer 7A.

The host material contained in the second interlayer 7B is preferably the same as that of the blue light-emitting layer 8. By doing so, the carrier (electrons or holes) can be smoothly transferred between the light-emitting layer and the second interlayer 7B having the same host material. Consequently, an increase in driving voltage of the light-emitting element 1 can be adequately inhibited or prevented, and diffusion of excitons can be adequately inhibited or prevented.

In the second interlayer 7B having such a constitution, the second interlayer 7B is preferably insular (in a scattered form). By doing so, a first portion where the second interlayer 7B is disposed and a second portion where the second interlayer 7B is not disposed are reliably formed, and, in the second portion where the second interlayer 7B is not disposed, the blue light-emitting layer 8 and the green light-emitting layer 9 can be in reliable contact with each other.

Furthermore, when the first portion (where the second interlayer 7B is disposed) or the second portion is in a scattered form, the first portion is preferably formed so as to be approximately uniform in the surface direction. By doing so, variation in characteristic at each portion of the second interlayer 7B can be reliably prevented from occurring. Therefore, the second interlayer 7B can be effectively prevented from being locally degraded or deteriorated.

The thickness of the second interlayer 7B is not particularly limited, but is preferably about 2 to 10 nm and more preferably about 3 to 7 nm. By setting the thickness of the second interlayer 7B in this range, diffusion of excitons (holes and electrons) can be inhibited or prevented to reliably adjust the transfer of the excitons.

Green Light-Emitting Layer

The green light-emitting layer (third light-emitting layer) 9 is constituted by containing a green light-emitting material that emits green light (third color).

The green light-emitting material is not particularly limited, and examples thereof include various types of green fluorescent materials and green phosphorescent materials. These materials can be used alone or in combination of two or more thereof.

As the green fluorescent material, any material that emits green fluorescence can be used without particular limitation, and examples thereof include coumarin derivatives, quinacridone and its derivatives such as a quinacridone derivative represented by the following Formula (25), 9,10-bis[(9-ethyl-3-carbazole)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-{2-ethylhexyloxy}benzene)], and poly[(9,9-dioctyl-2,7-divinylenefluorenylene)-ortho-co-(2-methoxy-5-(2-ethoxylhexyloxy)-1,4-phenylene)].

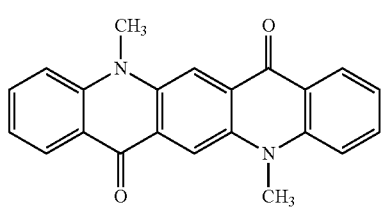

(25)

As the green phosphorescent materials, any material that emits green phosphorescence can be used without particular limitation, and examples thereof include metal complexes such as iridium, ruthenium, platinum, osmium, rhenium, and palladium complexes. More specific examples include fac-tris(2-phenylpyridine)iridium (Ir(ppy)3), bis(2-phenylpyridinate-N,$C^{2'}$)iridium (acetylacetonate), and fac-tris[5-fluoro-2-(5-trifluoromethyl-2-pyridine)phenyl-C,N]iridium.

The green light-emitting layer 9 further contains a host material regarding the blue light-emitting material as a guest material, in addition to the green light-emitting material.

The host material may be the same host material as those described in the red light-emitting layer (first light-emitting layer) 6.

The host material of the green light-emitting layer 9 is preferably an acene derivative (acene-based material), like the host material of the red light-emitting layer 6. By doing so, the green light-emitting layer 9 can emit green light with higher brightness and higher efficiency.

Furthermore, the host material of the green light-emitting layer 9 is preferably the same as that of the blue light-emitting layer 8. By doing so, green light and blue light can be emitted in a balanced manner in both the light-emitting layers 8 and 9.

Electron-Transporting Layer

The electron-transporting layer 10 has a function of transporting electrons injected from the cathode 12 through the electron injection layer 11 to the green light-emitting layer 9.

Examples of the constitutional material (electron-transporting material) of the electron-transporting layer 10 include quinoline derivatives such as organic metal complexes having 8-quinolinol or its derivatives as the ligand (e.g., tris(8-quinolinolato)aluminum ($Alq_3$)), oxadiazole derivatives, perylene derivatives, pyridine derivatives, pyrimidine derivatives, quinoxaline derivatives, diphenylquinone derivatives, and nitro-substituted fluorene derivatives. These materials can be used alone or in combination of two or more thereof.

The average thickness of the electron-transporting layer 10 is not particularly limited, but is preferably about 0.5 to 100 nm and more preferably about 1 to 50 nm.

Electron Injection Layer

The electron injection layer 11 has a function of improving the efficiency in electron injection from the cathode 12.

Examples of the constitutional material (electron injection material) of the electron injection layer 11 include various inorganic insulating materials and various inorganic semiconductor materials.

Examples of the inorganic insulating material include alkali metal chalcogenides (oxides, sulfides, selenides, and tellurides), alkali-earth metal chalcogenides, halides of alkali metals, and halides of alkali-earth metals. These materials can be used alone or in combination of two or more thereof. The electron injection layer having such a material as the main material can has an improved electron injection property. In particular, since the alkali metal compounds (e.g., alkali metal chalcogenide and halides of alkali metals) have very low work functions, the light-emitting element 1 can emit light with high brightness by constituting the electron injection layer 11 using these materials.

Examples of the alkali metal chalcogenide include $Li_2O$, LiO, $Na_2S$, $Na_2Se$, and NaO.

Examples of the alkali-earth metal chalcogenide include CaO, BaO, SrO, BeD, BaS, MgO, and CaSe.

Examples of the halide of alkali metal include CsF, LiF, NaF, KF, LiCl, KCl, and NaCl.

Examples of the halide of alkali-earth metal include $CaF_2$, $BaF_2$, $SrF_2$, $MgF_2$, and $BeF_2$.

Examples of the inorganic semiconductor material include oxides, nitrides, and oxynitrides containing at least one element selected from the group consisting of Li, Na, Ba, Ca, Sr, Yb, Al, Ga, In, Cd, Mg, Si, Ta, Sb, and Zn. These materials can be used alone or in combination of two or more thereof.

The average thickness of the electron injection layer 11 is not particularly limited, but is preferably about 0.1 to 1000 nm, more preferably about 0.2 to 100 nm, and most preferably about 0.2 to 50 nm.

Sealing Member

The sealing member 13 is disposed so as to cover the anode 3, the laminate 15, and the cathode 12 and has a function of hermetically sealing them and shutting off oxygen and moisture. By providing the sealing member 13, effects such as improvement in reliability and prevention of degradation and deterioration (improvement of durability) of the light-emitting element 1 can be achieved.

Examples of the constitutional material of the sealing member 13 include Al, Au, Cr, Nb, Ta, Ti, and alloys containing these elements, silicon oxide, and various resin materials. When the constitutional material of the sealing member 13 is electrically conductive, it is preferable to dispose insulating films, according to need, between the sealing member 13 and the anode 3, the laminate 15, and the cathode 12, for preventing short circuit.

Alternatively, a tabular sealing member 13 may be disposed so as to oppose the substrate 2, and a sealing material, such as a thermosetting resin, may seal between them.

According to the thus-constituted light-emitting element 1, since the first interlayer 7A and the second interlayer 7B are disposed, respectively, between the red light-emitting layer 6 and the blue light-emitting layer 8 and between the blue light-emitting layer 8 and the green light-emitting layer 9, as described above, the movement of holes and electrons between the red light-emitting layer 6 and the blue light-emitting layer 8 can be adjusted, and also the movement of holes and electrons between the blue light-emitting layer 8 and the green light-emitting layer 9 can be adjusted. Therefore, the transfer of energy of excitons between the red light-emitting layer 6 and the blue light-emitting layer 8 can be blocked, and also the transfer of energy of excitons between the blue light-emitting layer 8 and the green light-emitting layer 9 can be blocked. As a result, all of the red light-emitting layer 6, the blue light-emitting layer 8, and the green light-emitting layer 9 are allowed to efficiently emit light. Therefore, the light-emitting element 1 can more reliably emit white light.

In this embodiment, the blue light-emitting layer 8, the second interlayer 7B, and the green light-emitting layer 9 are laminated between the anode 3 and the cathode 12 in this order, but the order is not limited to this. They may be laminated in the order of the green light-emitting layer 9, the second interlayer 7B, and the blue light-emitting layer 8, between the anode 3 and the cathode 12.

That is, in this embodiment, the second light-emitting layer is the blue light-emitting layer 8, and the third light-emitting layer is the green light-emitting layer 9, but the second light-emitting layer may be a green light-emitting layer, and the third light-emitting layer may be a blue light-emitting layer.

Process of producing light-emitting element The light-emitting element 1 described above can be produced, for example, as follows.

(1) First, a substrate 2 is prepared, and an anode 3 is formed on this substrate 2.

The anode 3 can be formed by, for example, chemical vapor deposition (CVD) such as plasma CVD or thermal CVD, dry plating such as vacuum deposition, wet plating such as electroplating, spraying, a sol-gel method, an MOD method, or adhesion of metal foil.

(2) Then, a hole injection layer 4 is formed on the anode 3.

The hole injection layer 4 can be formed by, for example, a gaseous phase process using, for example, CVD or dry plating such as vacuum deposition or sputtering.

Alternatively, the hole injection layer 4 can be formed by, for example, supplying, onto the anode 3, a hole injection layer-forming material in which a hole injection material is dissolved in a solvent or dispersed in a dispersion medium and then drying the hole injection layer-forming material (removal of the solvent or the dispersion medium).

The supply of the hole injection layer-forming material may be performed by application such as spin coating, roll coating, or ink-jet printing. By employing the coating, the hole injection layer 4 can be relatively easily formed.

Examples of the solvent or the dispersion medium used for preparing the hole injection layer-forming material include various inorganic solvents, various organic solvents, and their solvent mixtures.

The drying can be performed by, for example, being placed in the air or the atmosphere under a reduced pressure, heating, or blowing of an inert gas.

Prior to this step, the upper surface of the anode 3 may be subjected to oxygen plasma treatment. By doing so, the upper surface of the anode 3 is provided with a lyophilic property; organic substances adhering on the upper surface of the anode 3 can be removed (cleaned); and the work function near the upper surface of the anode 3 can be adjusted.

Here, conditions for the oxygen plasma treatment are preferably, for example, a plasma power of about 100 to 800 W, an oxygen gas flow rate of about 50 to 100 mL/min, a feeding rate of the member to be treated (anode 3) of about 0.5 to 10 mm/sec, and a temperature of a support supporting the member to be treated of about 70 to 90° C.

(3) Then, a hole-transporting layer 5 is formed on the hole injection layer 4.

The hole-transporting layer 5 can be formed, for example, by a gaseous phase process using, for example, CVD or dry plating such as vacuum deposition or sputtering.

Alternatively, the hole-transporting layer 5 can be formed by, for example, supplying, onto the hole injection layer 4, a hole-transporting layer-forming material in which a hole-transporting material is dissolved in a solvent or dispersed in a dispersion medium and then performing drying (removal of the solvent or the dispersion medium).

(4) Then, a red light-emitting layer 6 is formed on the hole-transporting layer 5.

The red light-emitting layer 6 can be formed, for example, by a gaseous phase process using, for example, CVD or dry plating such as vacuum deposition or sputtering.

(5) Then, a first interlayer 7A is formed on the red light-emitting layer 6.

The first interlayer 7A can be formed, for example, by a gaseous phase process using, for example, CVD or dry plating such as vacuum deposition or sputtering.

Alternatively, the first interlayer 7A can be formed by, for example, supplying, onto the red light-emitting layer 6, a first interlayer-forming material in which a constitutional material is dissolved in a solvent or dispersed in a dispersion medium and then performing drying (removal of the solvent or the dispersion medium).

(6) Then, a blue light-emitting layer 8 is formed on the first interlayer 7A.

The blue light-emitting layer 8 can be formed, for example, by a gaseous phase process using, for example, CVD or dry plating such as vacuum deposition or sputtering.

(7) Then, a second interlayer 7B is formed on the blue light-emitting layer 8.

The second interlayer 7B is formed by the same method as that of the first interlayer 7A described in the step (5).

(8) Then, a green light-emitting layer 9 is formed on the second interlayer 7B.

The green light-emitting layer 9 can be formed, for example, by a gaseous phase process using, for example, CVD or dry plating such as vacuum deposition or sputtering.

(9) Then, an electron-transporting layer 10 is formed on the green light-emitting layer 9.

The electron-transporting layer 10 can be formed, for example, by a gaseous phase process using, for example, CVD or dry plating such as vacuum deposition or sputtering.

Alternatively, the electron-transporting layer 10 can be formed by, for example, supplying, onto the green light-emitting layer 9, an electron-transporting layer-forming material in which an electron-transporting material is dissolved in a solvent or dispersed in a dispersion medium and then performing drying (removal of the solvent or the dispersion medium).

(10) Then, an electron injection layer 11 is formed on the electron-transporting layer 10.

When the constitutional material of the electron injection layer 11 is an inorganic material, the electron injection layer 11 can be formed, for example, by a gaseous phase process using, for example, CVD or dry plating such as vacuum deposition or sputtering or by application and firing of an inorganic microparticle ink.

(11) Then, an cathode 12 is formed on the electron injection layer 11.

The cathode 12 can be formed, for example, by vacuum deposition, sputtering, adhesion of metal foil, or application and firing of a metal microparticle ink.

The light-emitting element 1 can be obtained by the process as described above.

Lastly, a sealing member 13 is coated so as to cover the obtained light-emitting element 1 and is joined to the substrate 2.

The thus-described light-emitting element 1 can be used as, for example, a light source. Furthermore, multiple light-emitting elements 1 arranged in a matrix can construct a display apparatus (the display device of the invention).

The driving system of the display apparatus is not particularly limited and may be an active matrix system or a passive matrix system.

Display Device

An example of the display apparatus to which the display device of the invention is applied will be described below.

Figure 2:
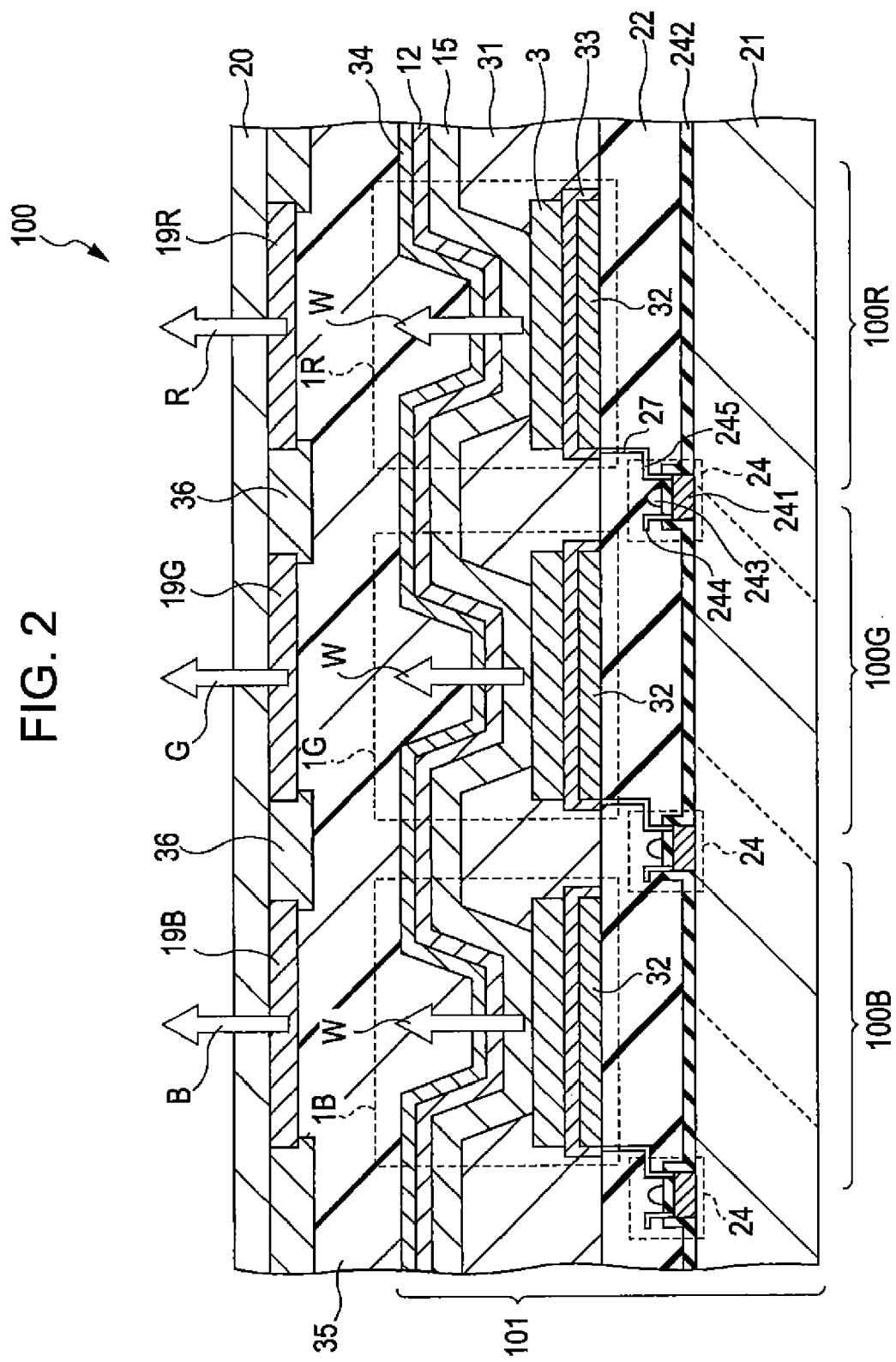
FIG. 2 is a vertical cross-sectional view illustrating an embodiment of the display apparatus to which the display device of the invention is applied.

FIG. 2 is a vertical cross-sectional view illustrating an embodiment of the display apparatus to which the display device of the invention is applied.

The display apparatus 100 shown in FIG. 2 includes a substrate 21; a plurality of light-emitting elements 1R, 1G, and 1B, and a plurality of color filters 10R, 10G, and 10B, which are disposes so as to correspond to sub-pixels 100R, 100G, and 100B, respectively; and a plurality of driving transistors 24 for driving the corresponding light-emitting elements 1R, 1G, and 1B. The display apparatus 100 shown here is a display panel having a top emission structure.

The plurality of the driving transistors 24 are disposed on the substrate 21, and a planarizing layer 22 made of an insulating material is formed so as to cover the driving transistors 24.

Each of the driving transistors 24 includes a semiconductor layer 241 made of silicon, a gate insulating layer 242 disposed on the semiconductor layer 241, a gate electrode 243 disposed on the gate insulating layer 242, a source electrode 244, and a drain electrode 245.

The light-emitting elements 1R, 1G, and 1B are disposed on the planarizing layer 22 so as to correspond to the driving transistors 24.

The light-emitting element 1R is composed of a reflection film 32, a corrosion prevention film 33, an anode 3, a laminate (organic EL emitting portion) 15, a cathode 12, and a cathode cover 34 laminated on the planarizing layer 22 in this order. In this embodiment, the anode 3 of each of the light-emitting elements 1R, 1G, and 1B is a pixel electrode and is electrically connected to the drain electrode 245 of each driving transistor 24 via a conductive portion (wiring) 27. The cathode 12 of each of the light-emitting elements 1R, 1G, and 1B is a common electrode.

The structures of the light-emitting elements 1G and 1B are the same as that of the light-emitting element 1R. Note that, in FIG. 2, the same constituents as those in FIG. 1 are denoted with the same reference numerals. The structures (characteristics) of the reflection films 32 of the light-emitting elements 1R, 1G, and 1B may differ from one another according to the wavelengths of light.

Between adjacent light-emitting elements 1R, 1G, and 1B, a partition wall 31 is provided. Furthermore, an epoxy layer 35 made of an epoxy resin is disposed on the light-emitting elements 1R, 1G, and 1B so as to cover them.

The color filters 19R, 19G, and 19B are disposed on the epoxy layer 35 so as to correspond to the light-emitting elements 1R, 1G, and 1B.

The color filter 19R filters white light W from the light-emitting element 1R to generate red light. The color filter 19G filters white light W from the light-emitting element 1G to generate green light. The color filter 19B filters white light W from the light-emitting element 1B to generate blue light. A full color image can be displayed by using these color filters 19R, 19G, and 19B by combining with the light-emitting elements 1R, 1G, and 1B.

Furthermore, a light-shielding layer 36 is formed between adjacent color filters 19R, 19G, and 19B. By doing so, unexpected emission of light by the sub-pixels 100R, 100G, and 100B can be prevented.

Furthermore, a sealing substrate 20 is provided on the color filters 19R, 19G, and 19B and the light-shielding layer 36 so as to cover them.

Such a display apparatus 100 described above may be a monochromatic display but can display a color image by selecting light-emitting materials used for the light-emitting elements 1R, 1G, and 1B.

The display apparatus 100 (display device of the invention) can be mounted on various electronic apparatuses.

Figure 3:
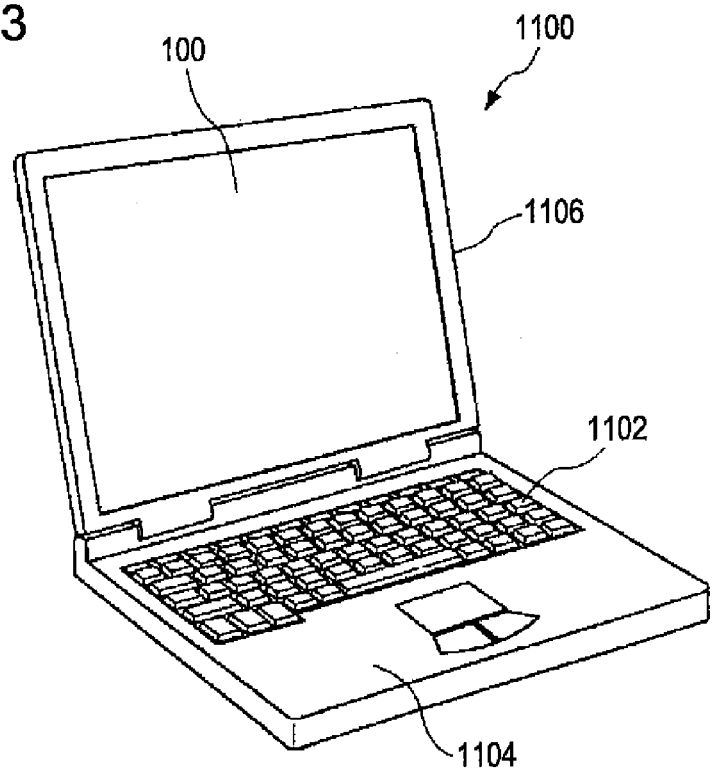
FIG. 3 is a perspective view illustrating a structure of a mobile (or notebook-type) personal computer to which an electronic apparatus of the invention is applied.

FIG. 3 is a perspective view illustrating a structure of a mobile (or notebook-type) personal computer to which the electronic apparatus of the invention is applied.

In FIG. 3, the personal computer 1100 is constituted of a body portion 1104 having a keyboard 1102 and a display unit 1106 having a display portion. The display unit 1106 is held via a hinge structure portion so as to be rotatable with respect to the body portion 1104.

In the personal computer 1100, the display portion of the display unit 1106 is constituted of the above-described display apparatus 100.

Figure 4:
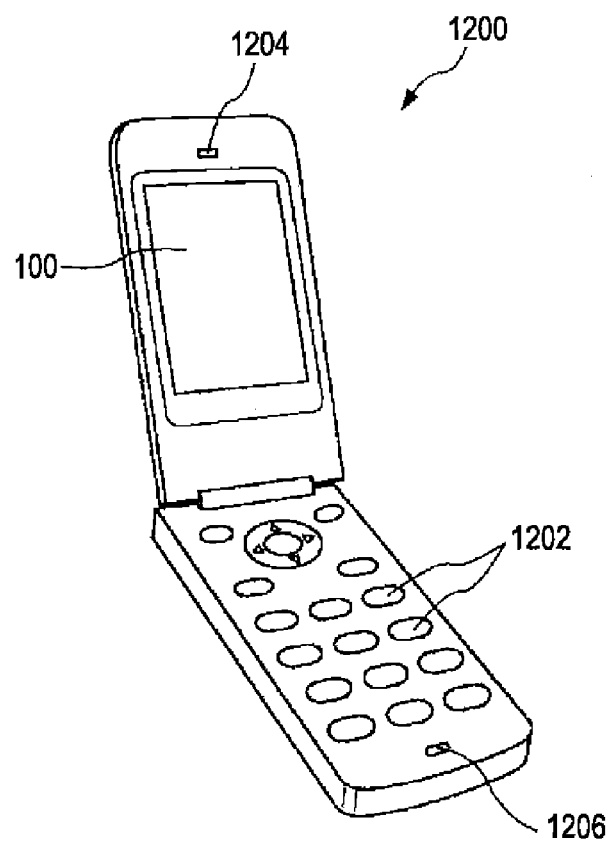
FIG. 4 is a perspective view illustrating a structure of a mobile phone (including PHS) to which an electronic apparatus of the invention is applied.

FIG. 4 is a perspective view illustrating a structure of a mobile phone (including PHS) to which an electronic apparatus of the invention is applied.

In FIG. 4, the mobile phone 1200 includes a plurality of operation buttons 1202, an ear piece 1204, a mouthpiece 1206, and also a display.

In the mobile phone 1200, the display portion is constituted of the above-described display apparatus 100.

Figure 5:
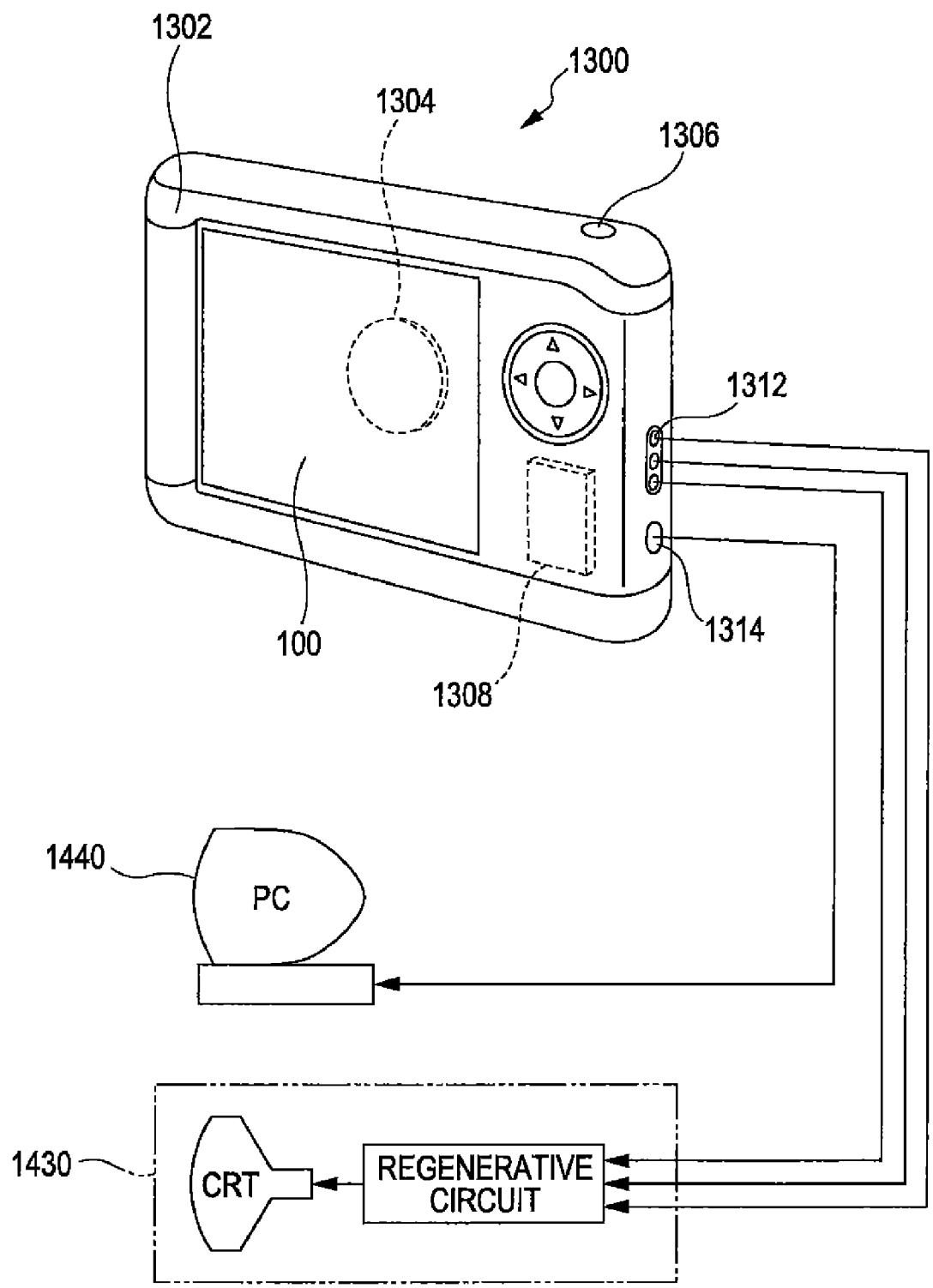
FIG. 5 is a perspective view illustrating a structure of a digital still camera to which an electronic apparatus of the invention is applied.

FIG. 5 is a perspective view illustrating a structure of a digital still camera to which an electronic apparatus of the invention is applied. Note that this drawing also schematically shows connection with external equipment.

Here, the digital still camera 1300 generates an image pickup signal (image signal) by photoelectrical conversion of an optical image of an object with an image pickup device such as a charge coupled device (CCD), whereas usual cameras in which a silver halide photographic film is exposed to an optical image of an object.

A display portion is provided on the back side of a case (body) 1302 of the digital still camera 1300. The display portion is configured so as to display an image based on image pickup signals from the CCD and functions as a finder for displaying an object as an electronic image.

In the digital still camera 1300, the display portion is constituted of the above-described display apparatus 100.

In the inside of the case, a circuit board 1308 is installed. The circuit board 1308 has a memory that can store (record) image pickup signals.

On the front side (the rear surface side in the structure shown in the drawing) of the case 1302, a light-receiving unit 1304 including an optical lens (image pickup optical system), a CCD, and the like is provided.

When a photographer confirms an object image displayed on the display portion and pushes down a shutter button 1306, the image pickup signal of the CCD at that time is transferred to and stored in the memory of the circuit board 1308.

In the digital still camera 1300, a video signal output terminal 1312 and data communication input-output terminal 1314 are provided on a side face of the case 1302. As shown in FIG. 5, the video signal output terminal 1312 is connected to a television monitor 1430, and the date communication input-output terminal 1314 is connected to a personal computer 1440, according to need. Furthermore, it is configured such that image pickup signals stored in the memory of the circuit board 1308 are output to the television monitor 1430 or the personal computer 1440 by a predetermined operation.

The electronic equipment of the invention can be applied to, in addition to the personal computer (mobile personal computer) shown in FIG. 3, the mobile phone shown in FIG. 4, and the digital still camera shown in FIG. 5, for example, television sets, video cameras, viewfinder type or monitor-direct-view type video tape recorders, laptop type personal computers, car navigation devices, pagers, electronic organizers (including those having communication functions), electronic dictionaries, electronic calculators, electronic game equipment, word processors, work stations, visual telephones, security television monitors, electronic binoculars, POS terminals, apparatuses including touch panels (for example, cash dispensers of financial institutions and automatic ticket vending machines), medical equipment (for example, electronic thermometers, blood-pressure monitors, blood-sugar meters, electrocardiograph displays, ultrasonographs, and endoscope displays), fishfinders, various types of measuring instrument, meters and gauges (for example, meters and gauges of vehicles, aircrafts, and ships), flight simulators, other various types of monitors, and projection displays such as projectors.

Thus, the light-emitting element, the display device, and the electronic apparatus of the invention have been described based on the embodiments shown in the drawings, but the invention is not limited thereto.

For example, in the above-described embodiments, the light-emitting element including three light-emitting layers has been described, but the number of the light-emitting layers may be two or four or more. In addition, the colors of light emitted by the light-emitting layers are not limited to R, G, and B described in the above-described embodiments. Furthermore, when the number of the light-emitting layers is two or four or more, white light can be emitted by suitably setting light emission spectrum of each light-emitting layer.

The number of the intermediate layers disposed between the light-emitting layers may be one or two or more.

EXAMPLES

Specific examples of the invention will be described below.

1. Production of Light-Emitting Element

Example 1

(1) First, a transparent glass substrate having an average thickness of 0.5 mm was prepared. Then, an ITO electrode (anode) was formed on the substrate so as to have an average thickness of 100 nm by sputtering.

Then, the substrate was immersed in acetone and then in 2-propanol for ultrasonic cleansing, followed by oxygen plasma treatment.

(2) Then, a hole injection layer having an average thickness of 40 nm was formed on the ITO electrode by vacuum deposition of the compound represented by above-mentioned Formula (7).

(3) Then, a hole-transporting layer having an average thickness of 10 nm was formed on the hole injection layer by vacuum deposition of the compound represented by the above-mentioned Formula (13).

(4) Then, a red light-emitting layer (first light-emitting layer) having an average thickness of 10 nm was formed on the hole-transporting layer by vacuum deposition of the constitutional material of the red light-emitting layer described below.

As the constitutional material of the red light-emitting layer, the compound (diindenoperylene derivative) represented by the above-mentioned Formula (17) was used as the red light-emitting material (guest material), and the compound (naphthacene derivative) represented by the above-mentioned Formula (18) was used as the host material. The content (doping concentration) of the red light-emitting material (dopant) in the light-emitting layer was set at 1.0 wt %.

(5) Then, a first interlayer having an average thickness of 7 nm was formed on the red light-emitting layer by vacuum deposition of the constitutional material of the first interlayer described below.

As the constitutional material of the first interlayer, the compound (acene-based material) represented by the above-mentioned Formula (18) was used as the host material, and the compound represented by the above-mentioned Formula (13) was used as the amine-based material. The host material content in the first interlayer was set at 50 wt %.

(6) Then, a blue light-emitting layer (second light-emitting layer) having an average thickness of 10 nm was formed on the first interlayer by vacuum deposition of the constitutional material of the blue light-emitting layer described below.

As the constitutional material of the blue light-emitting layer, the compound represented by the above-mentioned Formula (24) was used as the blue light-emitting material (guest material), and the compound (acene-based material) represented by the above-mentioned Formula (26) was used as the host material. The content (doping concentration) of the blue light-emitting material (dopant) in the blue light-emitting layer was set at 6.0 wt %.

(26)

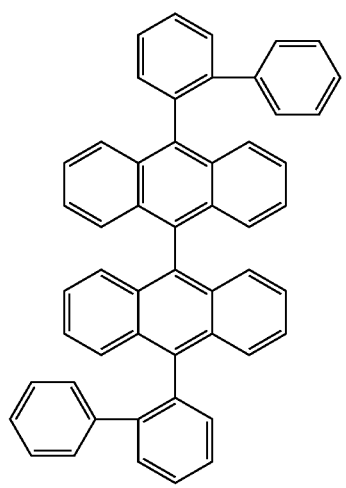

(7) Then, a second interlayer having an average thickness of 2 nm was formed on the blue light-emitting layer by vacuum deposition of the constitutional material of the second interlayer described below.

As the constitutional material of the second interlayer, the compound (acene-based material) represented by the above-mentioned Formula (26) was used as the host material.

(8) Then, a green light-emitting layer (third light-emitting layer) having an average thickness of 30 nm was formed on the second interlayer by vacuum deposition of the constitutional material of the green light-emitting layer described below.

As the constitutional material of the green light-emitting layer, the compound represented by the above-mentioned Formula (25) was used as the green light-emitting material (guest material), and the compound (acene-based material) represented by the above-mentioned Formula (27) was used as the host material. The content (doping concentration) of the green light-emitting material (dopant) in the green light-emitting layer was set at 1.0 wt %.

(9) Then, an electron-transporting layer having an average thickness of 10 nm was formed on the light-emitting layer by vacuum deposition of the constitutional material of the electron-transporting layer described below.

As the electron-transporting material, the above-mentioned $Alq_3$ was used.

(10) Then, an electron injection layer having an average thickness of 1 nm was formed on the electron-transporting layer by vacuum deposition of lithium fluoride (LiF).

(11) Then, a cathode having an average thickness of 150 nm was formed on the electron injection layer by vacuum deposition of Al.

(12) Then, a protection cover (sealing member) of glass was put on so as to cover each of the formed layers, followed by fixation and sealing with an epoxy resin.

By the above-described process, a light-emitting element, such as one shown in FIG. 1, was produced.

Example 2

A light-emitting element shown in FIG. 1 was produced as in Example 1, except that the average thickness of the second interlayer formed in the step (7) was 5 nm.

Example 3

A light-emitting element shown in FIG. 1 was produced as in Example 1, except that the average thickness of the second interlayer formed in the step (7) was 10 nm.

Example 4

A light-emitting element shown in FIG. 1 was produced as in Example 1, except that the second interlayer was formed in the step (7) using the compound (acene-based material) represented by the following Formula (27) as the host material so as to have an average thickness of 5 nm.

(27)

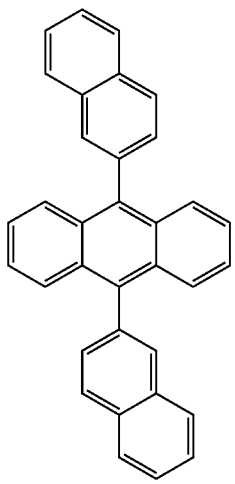

Comparative Example

A light-emitting element shown in FIG. 1 was produced as in Example 1, except that the second interlayer in the step (7) was not formed.

2. Evaluation

A current having a current density of 100 mA/cm$^2$ was applied between the anode and the cathode of each light-emitting element of Examples and Comparative Example with a direct current source, and the voltage applied to each light-emitting element and the current efficiency of light emitted from each light-emitting element were measured.

A current having a current density of 0.0003 mA/cm$^2$ was applied between the anode and the cathode of each light-emitting element of Examples and Comparative Example with a direct current source, and the intensity of light emitted from each light-emitting element was measured in wavelengths ranging from 400 to 800 nm.

Figure 6:
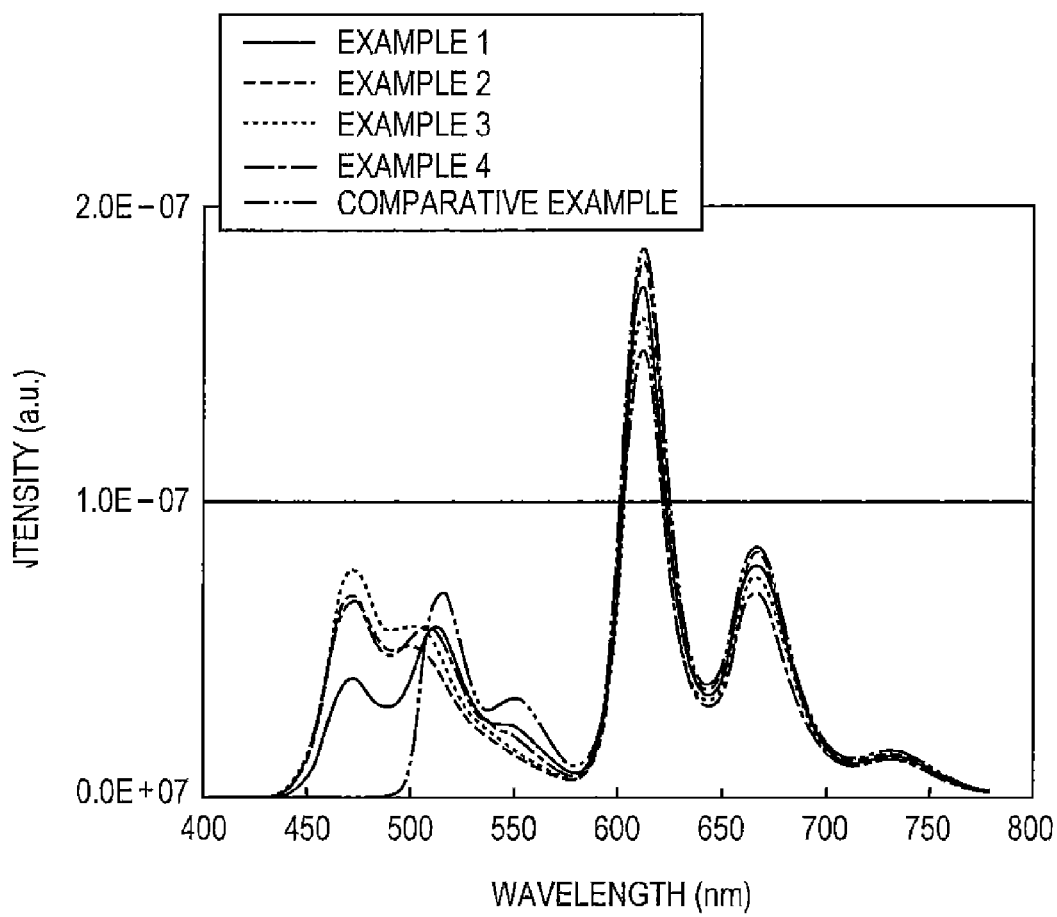
FIG. 6 is a graph showing intensities of light emitted from each light-emitting element of Examples and Comparative Example in wavelengths ranging from 400 to 800 nm.

The results are shown in Table 1 and FIG. 6.

emitting layer 8 to the green light-emitting layer 9, resulting in preferential emission of green light.

In contrast, it was confirmed that, in the light-emitting element of each Example, the transfer of energy from the blue light-emitting layer 8 to the green light-emitting layer 9 can be adequately inhibited by disposing the interlayer therebetween, resulting in appropriate emission of both blue and green light.

Furthermore, this tendency was more notably recognized in Examples 2 and 3 in which the host material of the second interlayer was the same as those of the blue light-emitting layer (second light-emitting layer) and the green light-emitting layer (third light-emitting layer) and also in which the thickness of the second interlayer was set within an appropriate range.

The entire disclosure of Japanese Patent Application No. 2009-291439, filed Dec. 22, 2009 and 2010-283364, filed Dec. 20, 2010 are expressly incorporated by reference herein.

What is claimed is:

1. A light-emitting element comprising:
    a cathode;
    an anode;
    a first light-emitting layer that is disposed between the cathode and the anode and is constituted by containing a host material and a guest material added to the host material and being a red light-emitting material that emits light in red as a first color;
    a second light-emitting layer that is disposed between the first light-emitting layer and the cathode and is constituted by containing a host material and a guest material added to the host material and being a second color light-emitting material that emits light in a second color;
    a third light-emitting layer that is disposed between the second light-emitting layer and the cathode and is constituted by containing a host material and a guest material added to the host material and being a third color light-emitting material that emits light in a third color;
    a first interlayer that is disposed between the first light-emitting layer and the second light-emitting layer so as to be in contact with them and is constituted by containing the same or the same type of material as the host material of the first light-emitting layer and not substantially containing materials having a light-emitting prop-

TABLE 1

| | Blue light-emitting layer | | Second interlayer | | Green light-emitting layer | | Current density (mA/cm$^2$) | Voltage (V) | Current efficiency (cd/A) |
|---|---|---|---|---|---|---|---|---|---|
| | Constitutional material | Thickness (nm) | Constitutional material | Thickness (nm) | Constitutional material | Thickness (nm) | | | |
| Example 1 | Formula (24) | 10 | Formula (26) | 2 | Formula (25) | 30 | 10.0 | 6.6 | 12.5 |
| Example 2 | Formula (26) | | | 5 | Formula (26) | | 10.0 | 6.7 | 12.8 |
| Example 3 | | | | 10 | | | 10.0 | 7.2 | 12.7 |
| Example 4 | | | Formula (27) | 5 | | | 10.0 | 7.5 | 12.3 |
| Comparative Example | | | — | — | | | 10.0 | 6.5 | 12.0 |

As obvious from Table 1, in a high brightness region, such as a current density of 100 mA/cm$^2$, the voltages and the current efficiencies in the light-emitting elements of Examples and Comparative Example did not significantly differ from one another, and every light-emitting element emitted white light.

However, in a low brightness region, such as a current density of 0.0003 mA/cm$^2$, as shown in FIG. 6, in the light-emitting element of Comparative Example, blue light was not emitted because of the transfer of energy from the blue lighterty, for adjusting movement of holes and electrons between the first light-emitting layer and the second light-emitting layer; and
    a second interlayer that is disposed between the second light-emitting layer and the third light-emitting layer so as to be in contact with them and is constituted by containing the same or the same type of material as the host material of the second light-emitting layer and/or the host material of the third light-emitting layer and not substantially containing materials having a light-emitting property, for adjusting movement of holes and electrons between the second light-emitting layer and the third light-emitting layer, the host material of the second light-emitting layer and/or the host material of the third light-emitting layer containing an anthracene-based material.

2. The light-emitting element according to claim 1, wherein the host material of the second light-emitting layer is the same as that of the third light-emitting layer.

3. The light-emitting element according to claim 1, wherein the host material of the second interlayer is the same as that of the second light-emitting layer.

4. The light-emitting element according to claim 1, wherein the second interlayer has a thickness of 2 to 10 nm.

5. The light-emitting element according to claim 1, wherein the first interlayer contains an amine-based material, in addition to the host material.

6. A display device comprising the light-emitting element according to claim 1.

7. An electronic apparatus comprising the display device according to claim 6.

8. The light-emitting element according to claim 1, wherein an energy level of a lowest unoccupied molecular orbit of the first interlayer is higher than an energy level of a lowest unoccupied molecular orbit of the first light-emitting layer and an energy level of a lowest unoccupied molecular orbit of the second light-emitting layer.

9. A light-emitting element comprising:
a cathode;
an anode;
a first light-emitting layer that is disposed between the cathode and the anode and is constituted by containing a host material and a guest material added to the host material and being a red light-emitting material that emits light in red as a first color;
a second light-emitting layer that is disposed between the first light-emitting layer and the cathode and is constituted by containing a host material and a guest material added to the host material and being a second color light-emitting material that emits light in a second color;
a third light-emitting layer that is disposed between the second light-emitting layer and the cathode and is constituted by containing a host material and a guest material added to the host material and being a third color light-emitting material that emits light in a third color;
a first interlayer that is disposed between the first light-emitting layer and the second light-emitting layer so as to be in contact with them and is constituted by containing the same or the same type of material as the host material of the first light-emitting layer and not substantially containing materials having a light-emitting property, for adjusting movement of holes and electrons between the first light-emitting layer and the second light-emitting layer; and
a second interlayer that is disposed between the second light-emitting layer and the third light-emitting layer so as to be in contact with them and is constituted by containing the same or the same type of material as the host material of the second light-emitting layer and/or the host material of the third light-emitting layer and not substantially containing materials having a light-emitting property, for adjusting movement of holes and electrons between the second light-emitting layer and the third light-emitting layer,
wherein an energy level of a lowest unoccupied molecular orbit of the first interlayer is higher than an energy level of a lowest unoccupied molecular orbit of the first light-emitting layer and an energy level of a lowest unoccupied molecular orbit of the second light-emitting layer.

10. The light-emitting element according to claim 9, wherein the host material of the second light-emitting layer is the same as that of the third light-emitting layer.

11. The light-emitting element according to claim 9, wherein the host material of the second interlayer is the same as that of the second light-emitting layer.

12. The light-emitting element according to claim 9, wherein the second interlayer has a thickness of 2 to 10 nm.

13. The light-emitting element according to claim 9, wherein the second interlayer contains an acene-based material as the host material.

14. The light-emitting element according to claim 9, wherein the first interlayer contains an amine-based material, in addition to the host material.

15. A display device comprising the light-emitting element according to claim 9.

16. A light-emitting element comprising:
a cathode;
an anode;
a first light-emitting layer that is disposed between the cathode and the anode and is constituted by containing a host material and a guest material added to the host material and being a red light-emitting material that emits light in red as a first color;
a second light-emitting layer that is disposed between the first light-emitting layer and the cathode and is constituted by containing a host material and a guest material added to the host material and being a second color light-emitting material that emits light in a second color;
a third light-emitting layer that is disposed between the second light-emitting layer and the cathode and is constituted by containing a host material and a guest material added to the host material and being a third color light-emitting material that emits light in a third color;
a first interlayer that is disposed between the first light-emitting layer and the second light-emitting layer so as to be in contact with them and is constituted by containing the same or the same type of material as the host material of the first light-emitting layer and not substantially containing materials having a light-emitting property, for adjusting movement of holes and electrons between the first light-emitting layer and the second light-emitting layer; and
a second interlayer that is disposed between the second light-emitting layer and the third light-emitting layer so as to be in contact with them and does not substantially contain materials having a light-emitting property, for adjusting movement of holes and electrons between the second light-emitting layer and the third light-emitting layer, wherein
the second interlayer is constituted by containing the same material as the host material of the second light-emitting layer and/or the host material of the third light-emitting layer, and
an energy level of a highest occupied molecular orbit of the first interlayer is lower than an energy level of a highest occupied molecular orbit of the first light-emitting layer and an energy level of a highest occupied molecular orbit of the second light-emitting layer.

17. The light-emitting element according to claim 16, wherein the host material of the second light-emitting layer is the same as that of the third light-emitting layer.

18. The light-emitting element according to claim 16, wherein the second interlayer contains an acene-based material as the host material.

19. The light-emitting element according to claim 16, wherein the first interlayer contains an amine-based material, in addition to the host material.

20. A display device comprising the light-emitting element according to claim 16.

21. The light-emitting element according to claim 16, wherein an energy level of a lowest unoccupied molecular orbit of the first interlayer is higher than an energy level of a lowest unoccupied molecular orbit of the first light-emitting layer and an energy level of a lowest unoccupied molecular orbit of the second light-emitting layer.

* * * * *